United States Patent
Caron et al.

(10) Patent No.: US 7,210,109 B2
(45) Date of Patent: Apr. 24, 2007

(54) EQUIVALENCE CHECKING OF SCAN PATH FLUSH OPERATIONS

(75) Inventors: Kenneth Michael Caron, Rochester, MN (US); Robert Lowell Kanzelman, Rochester, MN (US); Scott Henry Mack, Rochester, MN (US); Lance Gordon Thompson, Rochester, MN (US); Mark Allen Williams, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 10/875,476

(22) Filed: Jun. 24, 2004

(65) Prior Publication Data

US 2005/0289486 A1    Dec. 29, 2005

(51) Int. Cl.
  *G07F 17/50* (2006.01)
(52) U.S. Cl. .................. 716/4; 716/3; 716/5; 716/6; 716/11; 714/724; 714/726; 714/728
(58) Field of Classification Search ............ 716/4, 716/3, 5, 6, 11; 714/724, 726, 728
  See application file for complete search history.

(56) References Cited

U.S. PATENT DOCUMENTS

| | | | | |
|---|---|---|---|---|
| 5,684,808 A | * | 11/1997 | Valind | 714/726 |
| 6,289,491 B1 | * | 9/2001 | Dupenloup | 716/5 |
| 6,636,995 B1 | * | 10/2003 | Dean et al. | 714/724 |
| 6,668,362 B1 | * | 12/2003 | McIlwain et al. | 716/5 |
| 6,687,882 B1 | * | 2/2004 | McElvain et al. | 716/3 |
| 6,766,501 B1 | * | 7/2004 | Duggirala et al. | 716/11 |
| 6,886,145 B2 | * | 4/2005 | Davidson et al. | 716/6 |
| 6,954,912 B2 | * | 10/2005 | Srivastava et al. | 716/4 |
| 2004/0268274 A1 | * | 12/2004 | Khasidashvili et al. | 716/3 |
| 2005/0081130 A1 | * | 4/2005 | Rinderknecht et al. | 714/726 |
| 2005/0097486 A1 | * | 5/2005 | Tyler et al. | 716/6 |
| 2005/0235186 A1 | * | 10/2005 | Wang et al. | 714/728 |

* cited by examiner

*Primary Examiner*—Jack Chiang
*Assistant Examiner*—Nelson Lam
(74) *Attorney, Agent, or Firm*—Owen J. Garmon

(57) ABSTRACT

A method, apparatus, system, and signal-bearing medium that in an embodiment apply a latch behavior to a first and second netlist, where the latch behavior exhibits transparent behavior. Flush enabling conditions are applied to the first netlist and a second netlist. For each latch in a first scan chain in the first netlist, a corresponding latch in the second netlist is found. Cones of logic are then extracted from the latches under the constraints enabling the flush operation, and the cones of logic are compared for functional equivalence. If all the cones are functionally equivalent, then the flush reset states of the netlists are functionally equivalent. If at least one of the cones is not functionally equivalent, then the flush reset states of the two netlists are not equivalent.

17 Claims, 8 Drawing Sheets

EQUIVALENCE CHECKING OF SCAN PATH FLUSH OPERATIONS

FIELD

An embodiment of the invention generally relates to integrated circuits. In particular, an embodiment of the invention generally relates to determining the functional equivalence of netlists via cones of logic in the netlists.

BACKGROUND

The typical design methodology for integrated circuit designs—such as very large scale integrated (VLSI) circuits and application specific integrated circuits (ASICs)—is conventionally divided into the following three stages. First, a design capture step is performed using, for example, a high-level language synthesis package. Next, design verification is made on the resulting design. This includes simulations, timing analysis, and automatic test pattern generation (ATPG) tools. Finally, there is layout and eventual tape out of the device. The device is then tested, and the process may need to be reiterated one or more times until the desired design criteria are satisfied.

The design capture step typically involves the specification of a logic circuit by a designer. A hardware description language ("HDL") provides the designer with a mechanism for describing the operation of the desired logic circuit in a technology-independent manner.

Automated software tools available from companies such as Cadence Design Systems and Synopsys take an HDL description of the integrated circuit (sometimes referred to as a behavioral or register-transfer-level description) and map it into an equivalent netlist composed of the standard cells from a selected standard cell library. This process is commonly known as "synthesis."

A netlist is a data structure representation of the electronic logic system that comprises a set of modules, each of which comprises a data structure that specifies sub-components and their interconnection. The netlist describes the way standard cells and blocks are interconnected. Netlists are typically available in Verilog, EDIF (Electronic Design Interchange Format), or VHDL (Very High Speed Integrated Circuit Hardware Design Language) formats. Other software tools available from companies such as Cadence or Synopsys take a netlist comprised of standard cells and create a physical layout of the chip by placing the cells relative to each other to minimize timing delays or wire lengths, and then create electrical connections (or routing) between the cells to physically complete the desired circuit. Once a netlist has been generated from the logic design, silicon compilers, also called place and route tools, convert the netlist into a semiconductor circuit layout. The semiconductor circuit layout specifies the physical implementation of the circuit in silicon or other semiconductor materials.

Design verification involves verifying that the logic definition is correct, that the circuit implements the function expected by the designers, and that the many optimizations and transformations introduced during the design process do not alter the intended logical function of the design. Design verification may involve timing analysis and simulation tools. The data representation in the logic design database may be reformatted as needed prior to use by the timing analysis and simulation tools. The design undergoes design verification analysis in order to detect flaws in the design. The design is also analyzed using simulation tools to assess the functionality of the design. If errors are found or the resulting functionality is unacceptable, the designer modifies the design as needed. These design iterations help to ensure that the design satisfies its requirements.

Other verification methods include generating large numbers of test programs, either manually or with the help of various random and specific test generators, and running those test programs on a simulator that models the device operation. Formal verification (property checking) may also be used to prove correct behavior for selected aspects of the design. Formal verification is a technique that models a logic circuit as a state transition system using specifications for components in the system. For performance and productivity reasons, the simulations and formal checks are typically applied at the highest level (most abstract) model available, often a high level description of the design written in register transfer level VHDL or Verilog.

Historically, gate-level simulation on the final implementation netlist was used to check for functional errors that may have been introduced during the optimization and transformation process. Two models can theoretically be proven equivalent by exhaustive simulation. However, to achieve complete coverage by simulation, the results of $2^{(n+m)}$ simulation stimuli need to be checked, where n and m represent the number of circuit inputs and registers, respectively. Given the large number of circuit inputs and registers, this approach is not feasible, even for small designs. Practically, one would compromise the verification coverage by simulating only a small fraction of the possible simulation patterns.

Equivalence-checking is a formal verification technique used to check that two representations (or models) of an integrated circuit design are functionally equivalent. In an embodiment, special data structures and techniques such as Binary Decision Diagrams (BDD) and propositional satisfiability (SAT) are used to symbolically represent the state transitions of the designs and implicitly enumerate all possible stimuli. The two models to be compared can be at the same or on quite different levels of abstraction. For example, the first model could be represented at the register-transfer-level (for example, VHDL or Verilog) as a high-level design view defining the desired system functionality. The second model might be a gate or transistor-level representation of the actual circuit implementation. A proof of model equivalence implicitly validates any results from functional simulation computed on either model for both models. In a typical case, the high-level design view is extensively simulated to check the intended function of a system. Successful equivalence checks of the high-level view with the low-level implementation automatically extend the validity of the system simulation to the implementation.

Equivalence-checking tools commonly used in industry generally perform "combinational equivalence checking," which means they actually compare only the combinational logic between matched primary inputs, primary outputs, and internal memory elements (registers). Each primary output and internal register is treated as a comparison point that terminates a cone of combinational logic, and each internal register and primary input are treated as an input point that sources the cones of logic feeding one or more comparison points. First, a correspondence is established that maps all comparison points and input points in the reference design (model 1) to comparison points and input points in the revised design (model 2), and the logic function of each comparison point is extracted so that they may be compared for functional equivalence. If such a correspondence can be established for all comparison points, and if the formal analysis proves that all comparison points are functionally equivalent for all possible assignments of binary values to the input points, then it follows that the two models are functionally equivalent. Equivalence checking tools are commonly used to ensure that each new revision of a design remains functionally equivalent to the original high-level description.

It should be noted that although combinational equivalence-checking can definitively prove that two models are functionally equivalent, it cannot definitively prove non-equivalence due to the automatic treatment of internal registers as both comparison points and input points, which was done to reduce the sequential equivalency checking problem into a combinational one. It is quite possible for the equivalence check to report a difference in the combinational function at a comparison point that does not actually result in a difference in the sequential behavior as observed at the primary outputs of the design. Inserting cut-points to partition the designs at the internal registers introduces independent variables that can potentially result in "false negatives." In practice, however, the types of transformations made during a design process typically do not alter the combinational function of internal registers, so the tools are widely applicable.

One common situation where equivalence checking will report false-negatives is when one model is missing function that is present in the other model. For example, the design process may include a step that automatically inserts scan structures for manufacturing tests. In such cases, since the revised model has the additional test logic function which the original model does not, it is necessary to constrain the equivalence check such that the functional differences are masked, for example by asserting one or more signals (usually primary inputs) to values that disable the test logic function. Although the test logic that was inserted is not verified, the remaining logic is.

Another situation where false-negatives can and do arise is when scan chain connections between registers are reordered, which may be done to minimize overall wire length in a design based on new placement information. Since the scan connection and the associated test logic are part of the combinational logic cone of the comparison points resulting from internal registers, any changes to those connections will change the function of the combinational logic. In general, however, the exact order of the scan chain connections is relevant only to the ATPG (automatic test pattern generation) tools that must create the patterns for manufacturing test—the order does not affect the non-test function of the design. One solution, then, is to constrain the equivalence check, as previously described above, such that differences due to the test logic function are masked, for example by asserting scan clocks or scan enable signals to inactive values. The remaining logic function not directly associated with the test logic function is then verified.

This solution can leave a significant exposure for some design processes employing an LSSD (level sensitive scan design) style. In LSSD, registers are implemented as pairs of latches, usually called L1 and L2, which have three distinct clocks, usually called A, B and C. The A and C clocks are the enables of the L1 latch, which is dual ported. The A clock loads the scan data input and the C clock loads the functional data input. The B clock is the enable for the L2 latch and loads the data that is the output from the L1 latch. During normal (functional) operation, the A clock is held inactive, and the C and B clocks are pulsed in a non-overlapping manner to give the desired function of a register. During scan operation, however, the C clock is held inactive, and the A and B clocks are pulsed in a non-overlapping manner to scan the desired test pattern sequence through the LSSD registers in the scan chain.

It is also possible to assert both the A and B clocks active simultaneously while the C clock is held inactive, which enables both the L1 and L2 latches in the LSSD register to "flush" the scan in value immediately to the output. In such a situation, the LSSD register is acting like a combinational buffer, allowing a value at the primary scan input of the design to propagate through the entire scan chain. This feature of LSSD-based scan chains is often used to initialize the internal registers of the design to their reset state during power-on reset of the hardware. For example, if the primary scan input is asserted to logic 0 during the LSSD flush operation, that logic 0 will propagate to all LSSD registers in the scan chain to effectively reset them all to zero. If a particular LSSD register needs to be reset to a logic 1 instead, inverters can be inserted into the scan chain before and after that register to achieve the desired logic 1 value during flush operation.

When scan logic does not exist in the original model, but has been inserted into the revised model either manually or by an automated test-logic insertion process, the desired reset state values for the registers are typically specified either in a separate file or as initial value attributes in the HDL for the original model. As the test-logic insertion process converts flip-flops into LSSD registers and connects them into one or more scan chains, it must also add inverters or other logic as needed to produce the desired reset state during a flush scan operation. The previously discussed approach of constraining the equivalence check to mask out the test logic function will not guarantee that the revised model exhibits the desired reset state under flush scan operation.

Similarly, reordering the scan chains in a process where LSSD flush operation is used to set the power-on reset state is still possible, but care must be taken to ensure that the effective reset state is not altered. Since a proper power-on reset condition is critical to proper operation of the hardware, it is imperative that the reset values are validated. The previously discussed approach of constraining the equivalence check to mask out the scan logic will obviously not guarantee that the reset values remain consistent.

Thus, without a better way to handle scan chains, combinational equivalence checking cannot be used to validate the flush reset state, requiring the development of an otherwise unnecessary simulation environment for flush reset verification, which increases the cost and the development time of integrated circuits.

SUMMARY

A method, apparatus, system, and signal-bearing medium are provided that in an embodiment apply an alternative latch behavior to a first and second netlist, where the latch behavior exhibits transparent behavior and optionally an initial value capability. Flush enabling conditions are then applied to the first and second netlists. For each latch in a first scan chain in the first netlist, a corresponding latch in the second netlist is found. Cones of logic are then extracted from the latches under the constraints enabling the flush operation, and the cones of logic are compared for functional equivalence. If all the cones are functionally equivalent, then the flush reset states of the netlists are functionally equivalent. If at least one of the cones is not functionally equivalent, then the flush reset states of the two netlists are not equivalent.

DETAILED DESCRIPTION

Figure 1:
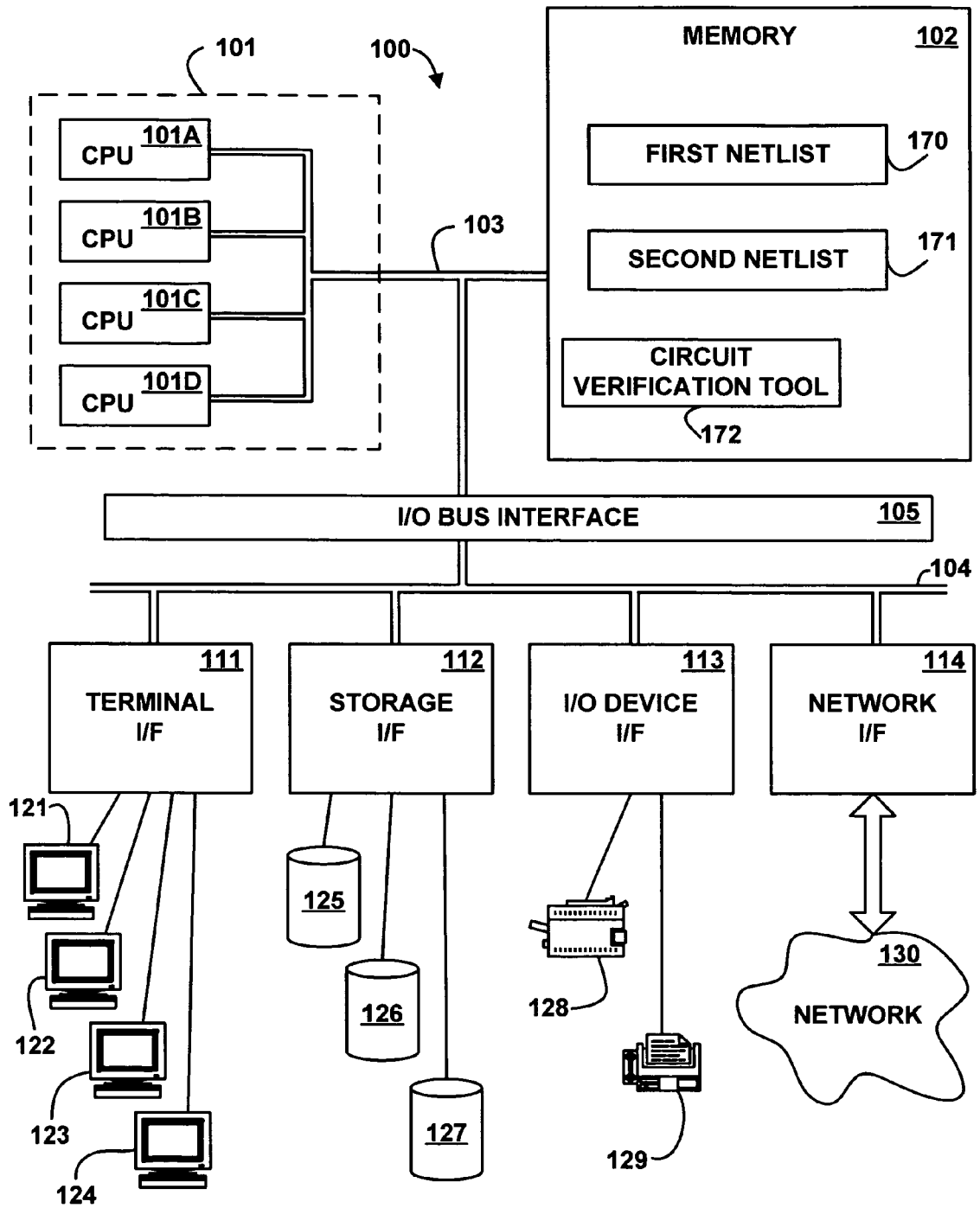
FIG. 1 depicts a block diagram of an example system for implementing an embodiment of the invention.

Referring to the Drawing, wherein like numbers denote like parts throughout the several views, FIG. 1 depicts a high-level block diagram representation of a computer system 100, according to an embodiment of the present invention. The major components of the computer system 100 include one or more processors 101, a main memory 102, a terminal interface 111, a storage interface 112, an I/O (Input/Output) device interface 113, and communications/network interfaces 114, all of which are coupled for inter-component communication via a memory bus 103, an I/O bus 104, and an I/O bus interface unit 105.

The computer system 100 contains one or more general-purpose programmable central processing units (CPUs) 101A, 101B, 101C, and 101D, herein generically referred to as the processor 101. In an embodiment, the computer system 100 contains multiple processors typical of a relatively large system; however, in another embodiment the computer system 100 may alternatively be a single CPU system. Each processor 101 executes instructions stored in the main memory 102 and may include one or more levels of on-board cache.

The main memory 102 is a random-access semiconductor memory for storing data and programs. The main memory 102 is conceptually a single monolithic entity, but in other embodiments the main memory 102 is a more complex arrangement, such as a hierarchy of caches and other memory devices.

The memory 102 includes a first netlist 170, a second netlist 171, and a circuit verification tool 172. Although the first netlist 170, the second netlist 171, and the circuit verification tool 172 are illustrated as being contained within the memory 102 in the computer system 100, in other embodiments some or all of them may be on different computer systems and may be accessed remotely, e.g., via the network 130. The computer system 100 may use virtual addressing mechanisms that allow the programs of the computer system 100 to behave as if they only have access to a large, single storage entity instead of access to multiple, smaller storage entities. Thus, while the first netlist 170, the second netlist 171, and the circuit verification tool 172 are illustrated as residing in the memory 102, these elements are not necessarily all completely contained in the same storage device at the same time.

The first netlist 170 and the second netlist 171 represent different models of the same intended logical function of an integrated circuit design. The second netlist 171 has undergone optimizations and/or transformations, which may make it different from the first netlist 170. Thus, the developer considers the first netlist 170 to be correct and desires to test equivalence of the second netlist 171 to the first netlist 170. The first netlist 170 and the second netlist 171 may be at the same level or different levels of abstraction. For example, the first netlist 170 may be represented at the register-transfer-level (for example, VHDL or Verilog) as a high-level design view defining the desired circuit functionality while the second netlist 171 may be a gate or transistor-level representation of the actual circuit implementation. But, in other embodiments, any level of abstraction and any appropriate format may be used.

The circuit verification tool 172 compares the first netlist 170 and the second netlist 171 for functional equivalence. In an embodiment, the circuit verification tool 172 includes instructions capable of executing on the processor 101 or statements capable of being interpreted by instructions executing on the processor 101 to perform the functions as further described below with reference to FIGS. 2B and 6. In another embodiment, the circuit verification tool 172 may be implemented in microcode. In yet another embodiment, the verification tool 172 may be implemented in hardware via logic gates and/or other appropriate hardware techniques, in lieu of or in addition to a processor-based system.

The memory bus 103 provides a data communication path for transferring data among the processors 101, the main memory 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as 110 processors (IOPs) or I/O adapters (IOAs), through the system I/O bus 104. The I/O interface units support communication with a variety of storage and I/O devices. For example, the terminal interface unit 111 supports the attachment of one or more user terminals 121, 122, 123, and 124.

The storage interface unit 112 supports the attachment of one or more direct access storage devices (DASD) 125, 126, and 127 (which are typically rotating magnetic disk drive storage devices, although they could alternatively be other devices, including arrays of disk drives configured to appear as a single large storage device to a host). The contents of the DASD 125, 126, and 127 may be loaded from and stored to the memory 102 as needed.

The I/O and other device interface 113 provides an interface to any of various other input/output devices or devices of other types. Two such devices, the printer 128 and the fax machine 129, are shown in the exemplary embodiment of FIG. 1, but in other embodiment many other such devices may exist, which may be of differing types. The network interface 114 provides one or more communications paths from the computer system 100 to other digital devices and computer systems; such paths may include, e.g., one or more networks 130.

The network 130 may be any suitable network or combination of networks and may support any appropriate protocol suitable for communication of data and/or code to/from the computer system 100.

The computer system 100 depicted in FIG. 1 has multiple attached terminals 121, 122, 123, and 124, such as might be typical of a multi-user "mainframe" computer system. Typically, in such a case the actual number of attached devices is greater than those shown in FIG. 1, although the present invention is not limited to systems of any particular size. The computer system 100 may alternatively be a single-user system, typically containing only a single user display and keyboard input, or might be a server or similar device which has little or no direct user interface, but receives requests from other computer systems (clients). In other embodiments, the computer system 100 may be implemented as a personal computer, portable computer, laptop or notebook computer, PDA (Personal Digital Assistant), tablet computer, pocket computer, telephone, pager, automobile, teleconferencing system, appliance, or any other appropriate type of electronic device.

It should be understood that FIG. 1 is intended to depict the representative major components of the computer system 100 at a high level, that individual components may have greater complexity than represented in FIG. 1, that components other than or in addition to those shown in FIG. 1 may be present, and that the number, type, and configuration of such components may vary. Several particular examples of such additional complexity or additional variations are disclosed herein; it being understood that these are by way of example only and are not necessarily the only such variations.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the computer system 100, and that, when read and executed by one or more processors 101 in the computer system 100, cause the computer system 100 to perform the steps necessary to execute steps or elements embodying the various aspects of an embodiment of the invention.

Moreover, while embodiments of the invention have and hereinafter will be described in the context of fully functioning computer systems, the various embodiments of the invention are capable of being distributed as a program product in a variety of forms, and the invention applies equally regardless of the particular type of signal-bearing medium used to actually carry out the distribution. The programs defining the functions of this embodiment may be delivered to the computer system 100 via a variety of signal-bearing media, which include, but are not limited to:

(1) information permanently stored on a non-rewriteable storage medium, e.g., a read-only memory device attached to or within a computer system, such as a CD-ROM readable by a CD-ROM drive;

(2) alterable information stored on a rewriteable storage medium, e.g., a hard disk drive (e.g., DASD 125, 126, or 127) or diskette; or (3) information conveyed to the computer system 100 by a communications medium, such as through a computer or a telephone network, e.g., the network 130, including wireless communications.

Such signal-bearing media, when carrying machine-readable instructions that direct the functions of the present invention, represent embodiments of the present invention.

In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

Figure 2A:
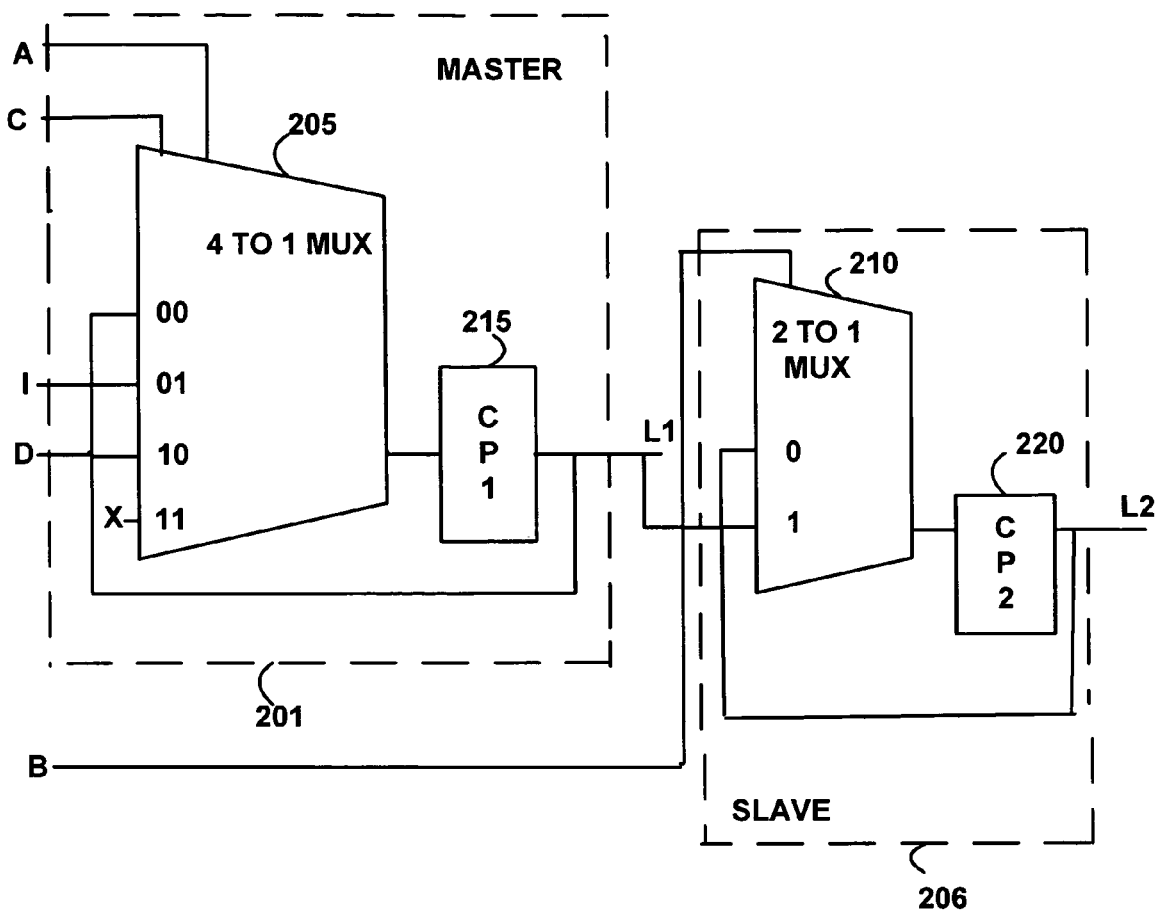
FIG. 2A depicts a block diagram of an example latch model, which illustrates the current modeling of an LSSD (level sensitive scan design) register for combinational equivalence checking.

FIG. 2A depicts a block diagram of an example model of an LSSD (level sensitive scan design) register for equivalence checking. FIG. 2A illustrates a pair of level sensitive latches 201 and 206. The latch 201 is often called L1 or master and is implemented as a 4-to-1 mux (multiplexer) 205 and a cut point 215. A and C are distinct clocks, which are the enables of the L1 latch 201, which is dual ported. The A clock loads the scan data input (I) and the C clock loads the functional data input (D).

The latch 206 is often called L2 or slave and is implemented in this example as a 2-to-1 mux 210 and a cut point 220. B is a clock, which is the enable for the L2 latch 206 and loads the data which is the output from the L1 latch 201. During normal (functional) operation, the A clock is held inactive, and the C and B clocks are pulsed in a non-overlapping manner to give the desired function of a register. During scan operation, however, the C clock is held inactive, and the A and B clocks are pulsed in a non-overlapping manner to scan the desired test pattern sequence through the LSSD registers in the scan chain.

Cutpoint blocks 215 and 220 serve as both comparison points and input points for the combinational equivalence check. The cutpoints effectively break all possible feedback loops involving the LSSD register, such that combinational cycles cannot exist, making the combinational equivalence check possible.

However, it is also valid for the A and B clocks to be active simultaneously while the C clock is held inactive, under which condition an LSSD register should "flush" the scan in value immediately to both the L1 and L2 outputs. In such a situation, the intent is that the LSSD register acts like a combinational buffer, allowing a value at the primary scan input of the design to propagate through the entire scan chain. This feature of LSSD-based scan chains is often used to initialize the internal registers of the design to their reset state during power-on reset of the hardware. For example, if the primary scan input is asserted to logic 0 during the LSSD flush operation, that logic 0 will propagate to all LSSD registers in the scan chain to effectively reset them all to zero. If a particular LSSD register needs to be reset to a logic 1 instead, inverters can be inserted into the scan chain before and after that register to achieve the desired logic 1 value during flush operation.

The modeling of FIG. 2A does not allow the flush behavior due to the placement of the cutpoints 215 and 220. Instead, for example, when a prior art verification tool traces back through the logic of FIG. 2A from the cutpoint 220 to extract a cone of influence, such a tool encounters the cutpoint 215 and stops.

Figure 2B:
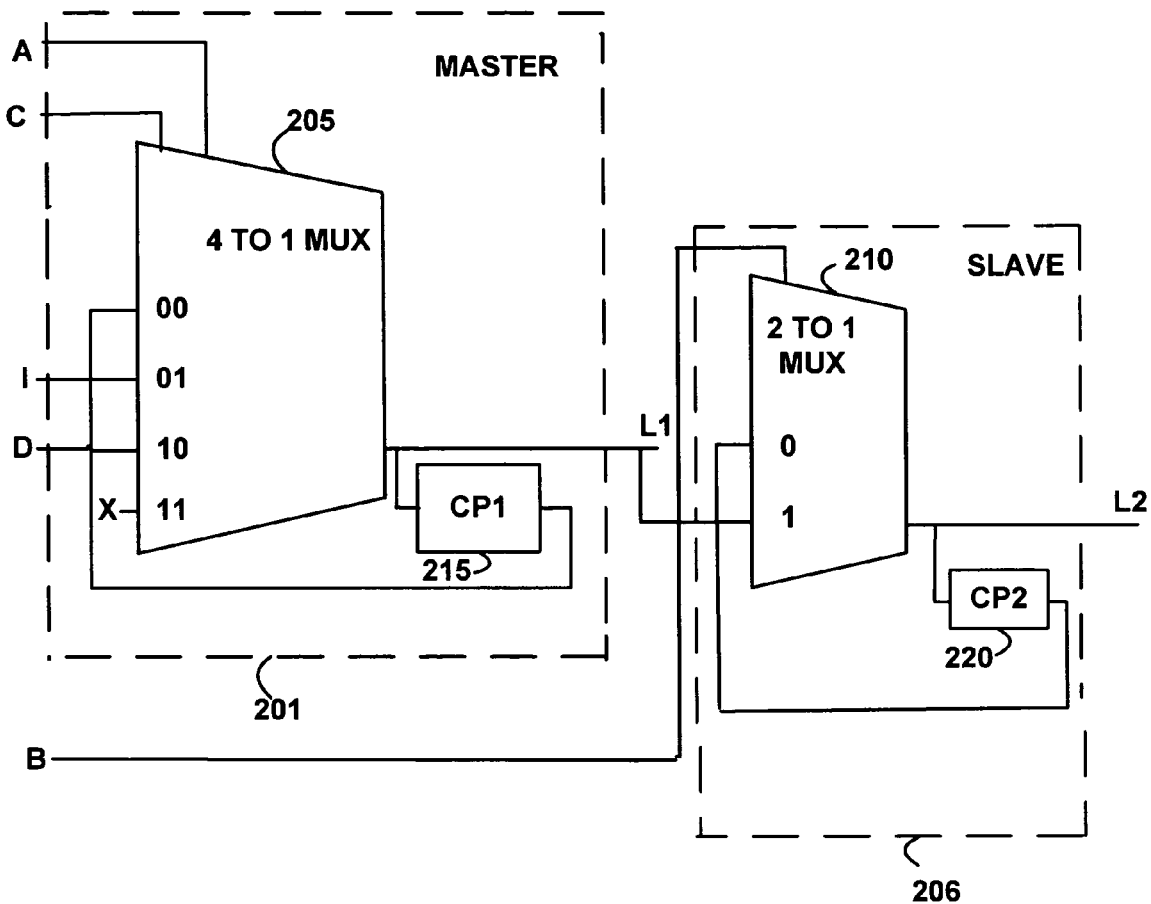
FIG. 2B depicts a block diagram of an example latch model, according to an embodiment of the invention.

FIG. 2B depicts a block diagram of an example latch model, according to an embodiment of the invention. Like FIG. 2A, FIG. 2B also includes the latches 201 and 206 and the cut points 215 and 220. But in contrast to FIG. 2A, the circuit verification tool 172 has adjusted the location of the cut points 215 and 220, so that when the verification tool 172 traces back from the cut point 220, the cut point 215 does not intervene in the trace back, and the circuit verification tool 172 proceeds unimpeded to the combinational logic feeding the master latch 201.

Figure 2C:
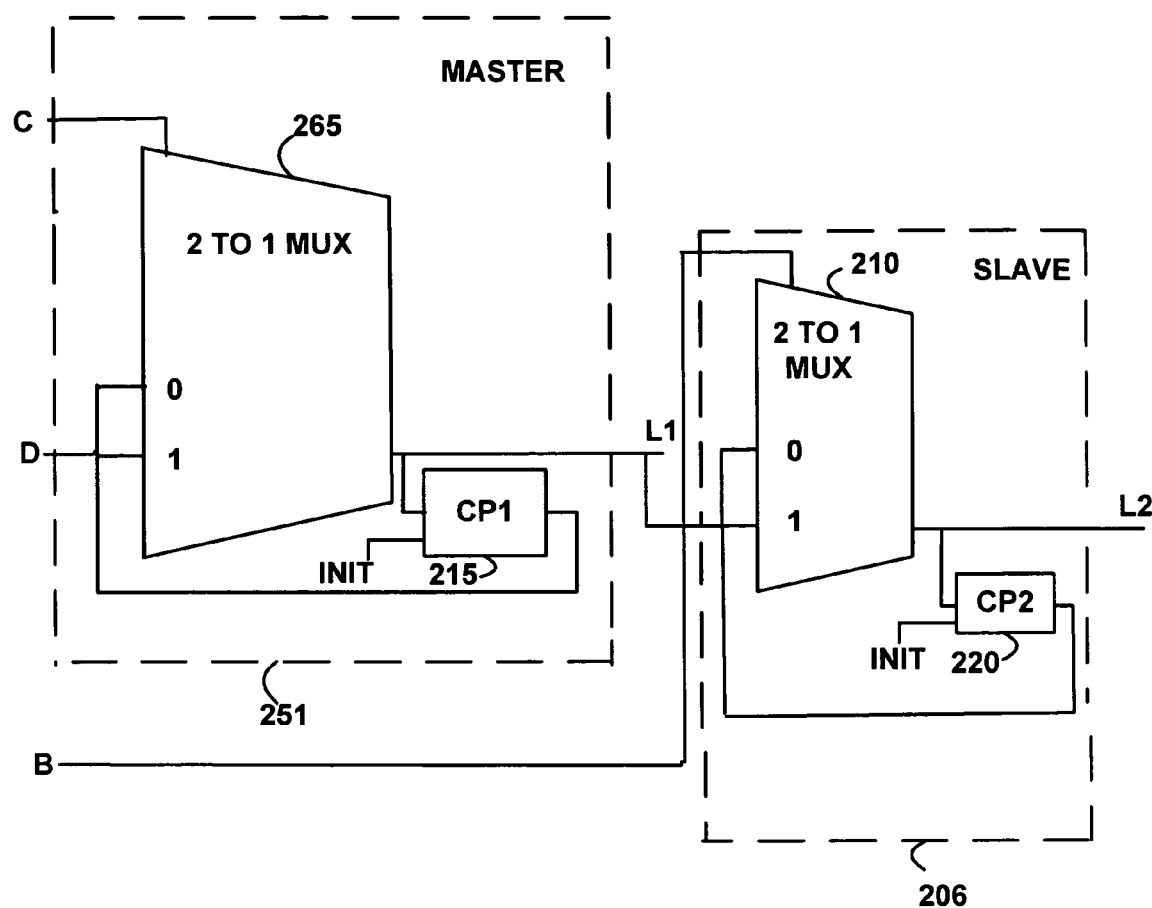
FIG. 2C depicts a block diagram of another example latch model with initial value capability, according to an embodiment of the invention.

FIG. 2C depicts a block diagram of another example latch model, according to an embodiment of the invention. FIG. 2C includes the latches 251 and 206. The latch 251 includes a 2 to 1 MUX 265 and the cut point 215. The latch 206 includes the 2 to 1 MUX 210 and the cut point 220. The cut points 215 and 220 are configured for transparent behavior. In contrast to FIG. 2B the cut points 215 and 220 have an additional input INIT, which specifies the initial value of the cut point. INIT is normally connected to either constant 0 or constant 1, but in general may be any cone of logic. The circuit verification tool 172 has an "init mode" option that causes the cut points to propagate the value from the INIT signal instead of the independent variable that is normally propagated from the cut point. When the "init mode" option is activated, for example, the extracted logic function of the comparison point at the cut point 215 is exactly the INIT signal when the C clock is zero (i.e., inactive). Thus, it is possible to evaluate the reset state of the design within an equivalency checking environment even though the reset logic is not explicitly implemented.

Figure 3:
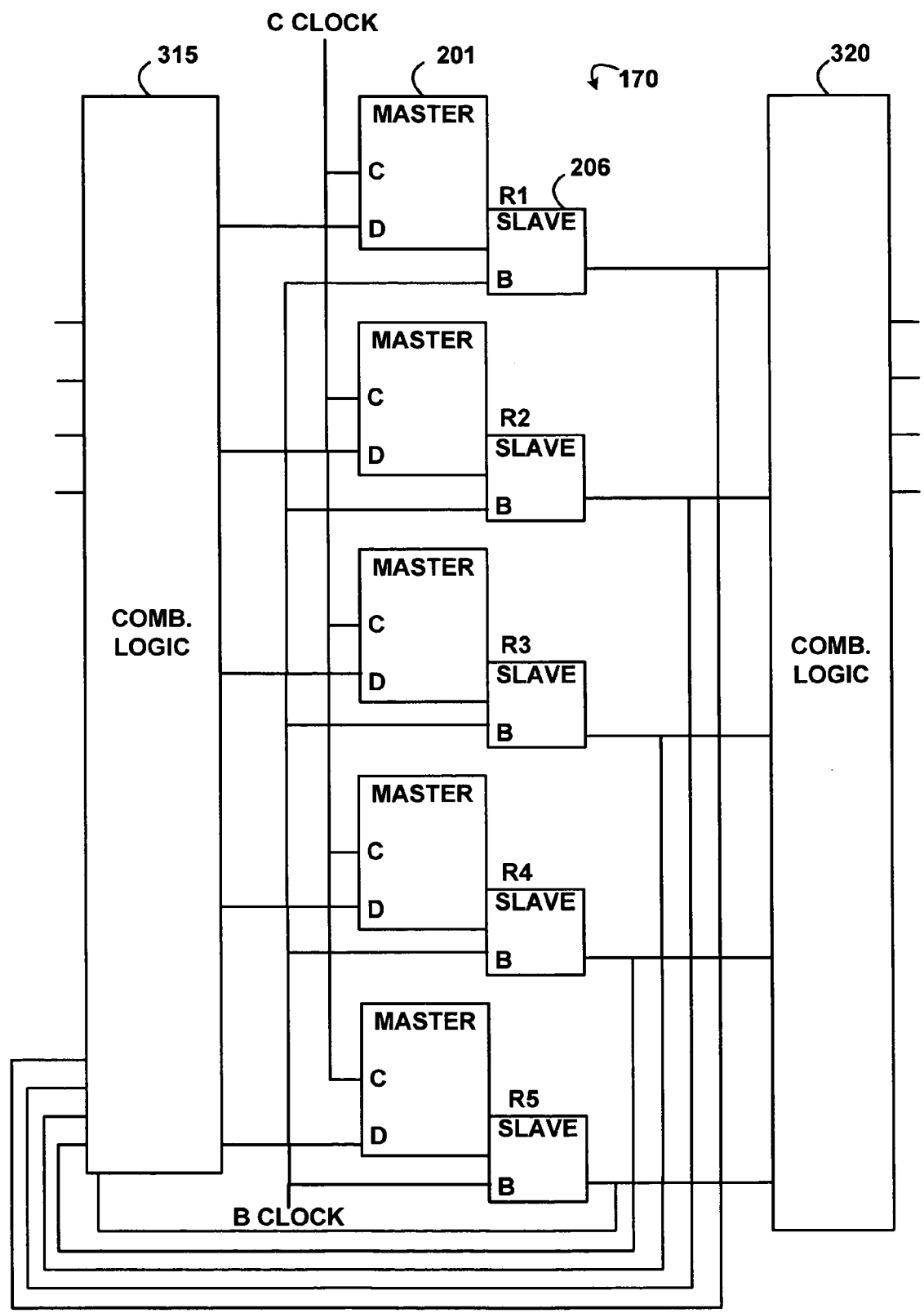
FIG. 3 depicts a block diagram of a functional view of a first netlist, according to an embodiment of the invention.

FIG. 3 depicts a block diagram of a functional view of the first netlist 170, according to an embodiment of the invention. FIG. 3 illustrates combinational logic 315 receiving inputs and sending output to a plurality of registers (R1, R2, R3, R4, and R5), which send output to combinational logic 320. FIG. 2B (or FIG. 2A) represents a model of one of the registers R1, R2, R3, R4, or R5. Each of the registers includes a master and a slave, such as the master 201 and the slave 206 for the register R1. Feedback is present from R1, R2, R3, R4, and R5 registers to the combinational logic 315. A prior art technique would use FIG. 2A to break the potential loop from, e.g., R4's (FIG. 3) CP1 215 (FIG. 2A) to R4's (FIG. 3) CP2 220 (FIG. 2A). Scan chains are not shown in the functional view of FIG. 3, but are described below with reference to FIGS. 4 and 5.

Figure 4:
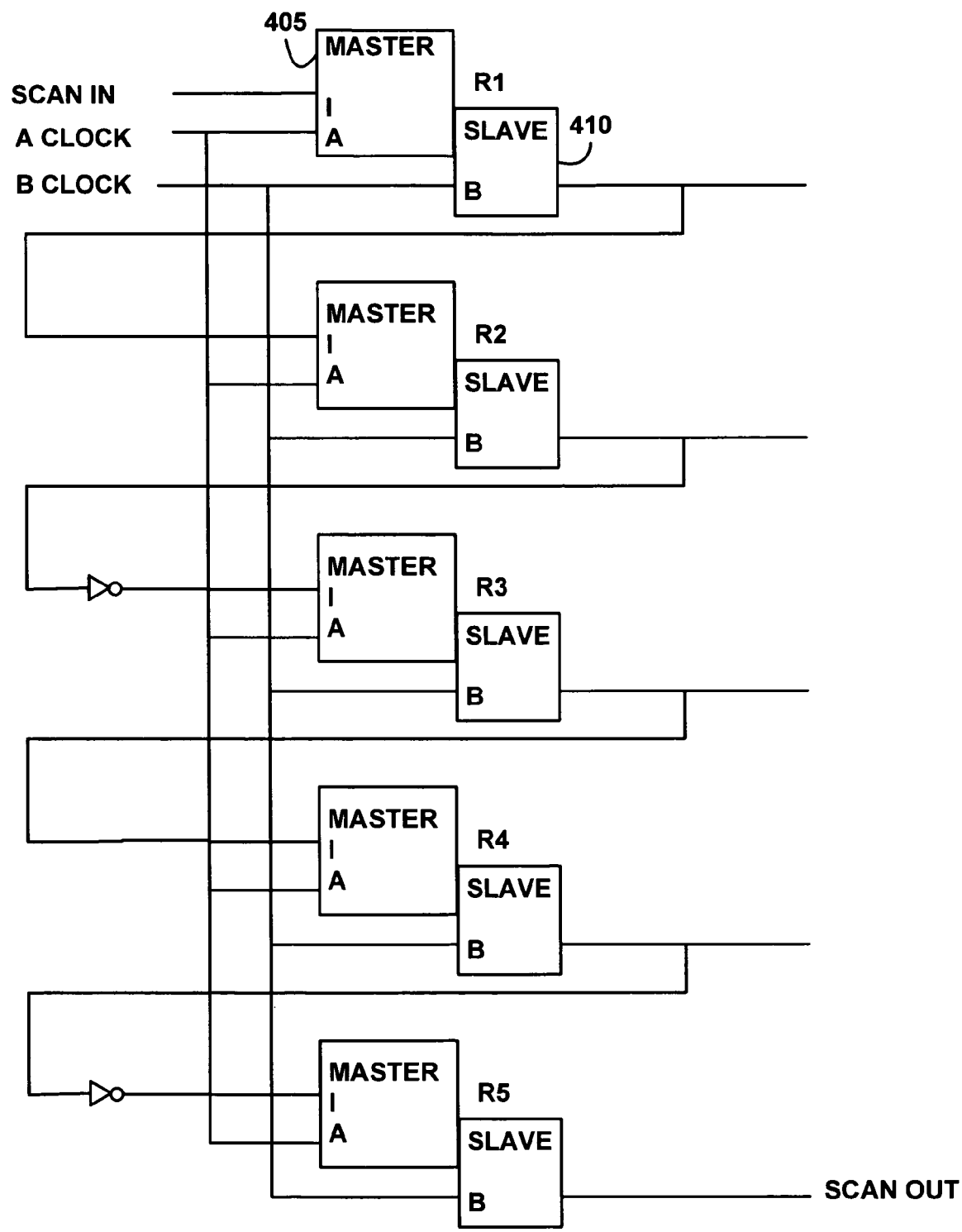
FIG. 4 depicts a block diagram of a first netlist scan chain, according to an embodiment of the invention.

FIG. 4 depicts a block diagram of a scan chain in the first netlist 170, according to an embodiment of the invention. The registers in the scan chain of FIG. 4 are ordered R1, R2, R3, R4, and R5. The flush reset value R1 and R2 and R3 and R4 and R5=0 0 1 1 0.

Figure 5:
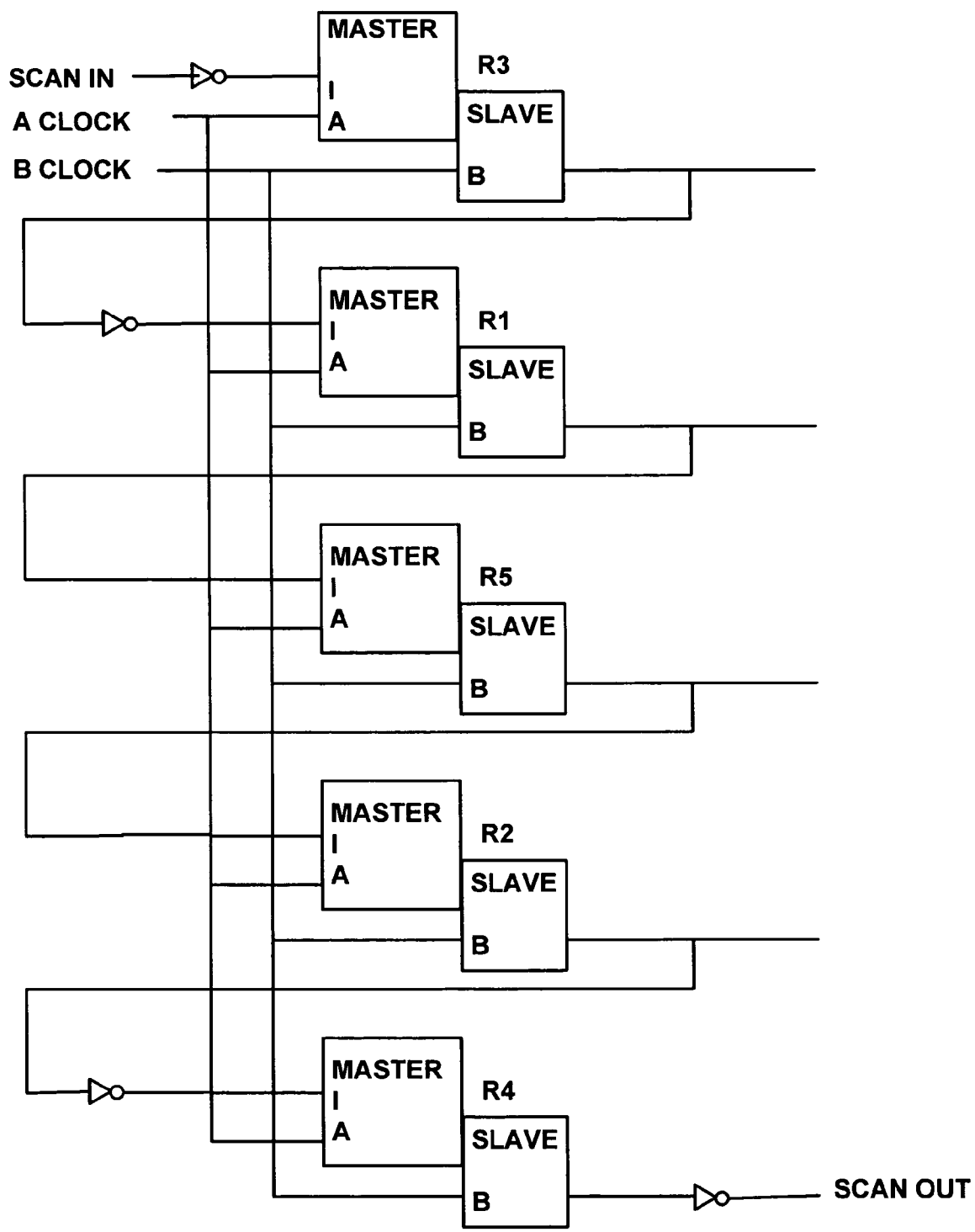
FIG. 5 depicts a block diagram of a second netlist scan chain, according to an embodiment of the invention.

FIG. 5 depicts a block diagram of a scan chain in the second netlist 171, according to an embodiment of the invention. The registers of the scan chain in the second netlist 171 are reordered (R3, R1, R5, R2, R4) from the scan chain (FIG. 4) in the first netlist 170. The flush reset value R1 and R2 and R3 and R4 and R5=0 0 0 1 0, which is equivalent to the reset state established in FIG. 4.

Figure 6:
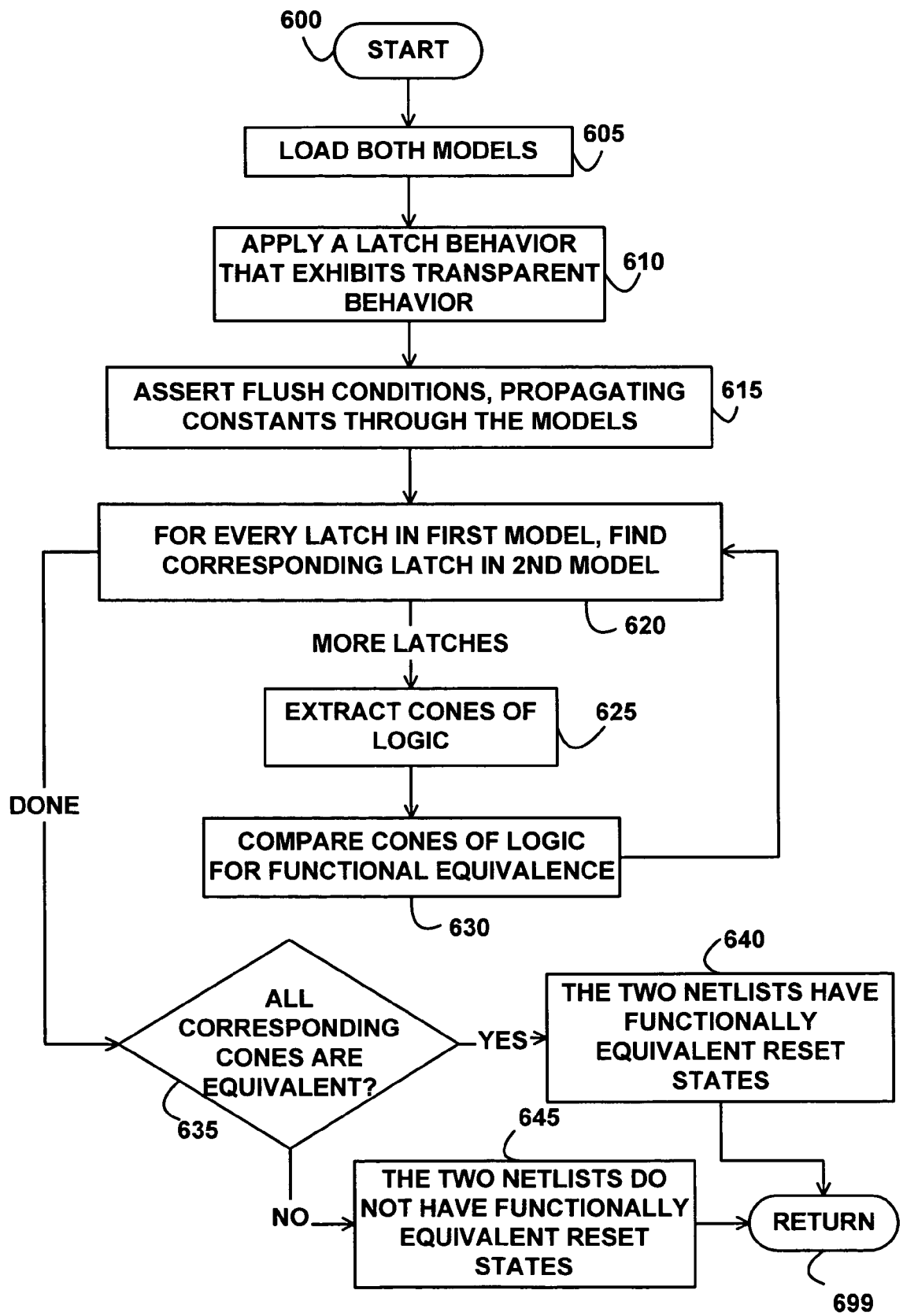
FIG. 6 depicts a flowchart of example processing for a circuit verification tool, according to an embodiment of the invention.

FIG. 6 depicts a flowchart of example processing for the circuit verification tool 172, according to an embodiment of the invention. Control begins at block 600. Control then continues to block 605 where the circuit verification tool 172 loads both the first netlist 170 and the second netlist 171.

Control then continues to block 610 where the circuit verification tool 172 applies a suitable latch behavior to the netlists 170 and 171 that exhibits transparent behavior. That is, latches in a cone of logic that represents a scan path are treated as transparent, meaning that when a clock is enabled, data flows through the latch without stopping. If one of the netlists 170 or 171 does not contain the circuitry necessary to establish the reset state, but the desired initial values are available as attributes in the netlist or a separate file, then a latch behavior supporting initial value specification is selected and the model is annotated with the initial values. The circuit verification tool 172 is then instructed to use the "init mode" for that netlist.

Control then continues to block 615 where the circuit verification tool 172 asserts flush conditions to the netlists 170 and 171, propagating constants through the models, as previously described above with reference to FIG. 5. Propagation of the constants removes structural feedback loops that would normally result from modeling all latches as fully transparent (as previously described above with reference to block 610).

Control then continues to block 620, which represents the start of a loop that processes every latch in the first netlist 170. So long as unprocessed latches in the first model remain at block 620, the circuit verification tool 172 finds a corresponding latch in the second netlist 171, and control continues from block 620 to block 625 where the circuit verification tool 172 extracts cones of logic from the netlists 170 and 171.

Control then continues to block 630 where the circuit verification tool 172 compares the extracted cones of logic for functional equivalence. Control then returns to block 620, as previously described above.

After all latches in the first scan chain have been processed by the loop starting at block 620, then control continues from block 620 to block 635 where the circuit verification tool 172 determines whether the logic function for each latch is equivalent under the flush condition constraint. If the determination at block 635 is true, the flush reset values of all corresponding latches are equivalent, so control continues to block 640 where the circuit verification tool reports that the two netlists 170 and 171 are functionally equivalent with respect to flush reset. Control then continues to block 699 where the logic of FIG. 6 returns.

If the determination at block 635 is false, then the flush reset values of at least one set of corresponding latches are not equivalent, so control continues to block 645 where the circuit verification tool 172 reports that the two netlists 170 and 171 are not functionally equivalent with respect to flush reset. Control then continues to block 699 where the logic of FIG. 6 returns.

The examples in the detailed description used LSSD registers (i.e., master/slave pairs), however embodiments of the invention may be applied to any design style that employs a scan path and flush behavior to establish the reset state of the system, such as a mux-scan design style. Also, the examples showed only trivial logic (e.g., inverters) in the scan chain logic, and only showed logic between LSSD registers. But, other embodiments of the invention may be generalized to arbitrarily complex combinational logic anywhere in the scan path, including in between the master and slave latches that together comprise an LSSD register in the drawings.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of the invention. But, the invention may be practiced without these specific details. In other instances, well-known circuits, structures, and techniques have not been shown in detail in order not to obscure the invention.

What is claimed is:

1. A method for comparing cones of logic comprising:
applying a latch behavior to a first netlist and a second netlist, wherein the latch behavior exhibits transparent behavior;
asserting flush enabling conditions to the first netlist and the second netlist;
for each of a plurality of latches in a first scan chain in the first netlist, finding a corresponding latch in a second scan chain in the second netlist;
for each of the plurality of latches in the first netlist, extracting a respective plurality of first cones of logic from the first scan chain, and extracting a respective plurality of second cones of logic from the second scan chain; and
comparing each of the respective first and second cones of logic for functional equivalence, wherein the comparing further comprises determining whether a logic function for each of the corresponding latches is equivalent under the flush enabling condition.

2. The method of claim 1, further comprising:
reporting that flush reset states of the first netlist and the second netlist are functionally equivalent if each of the respective first and second cones of logic are functionally equivalent.

3. The method of claim 1, wherein the asserting the flush enabling conditions further comprises:
propagating constants through the first netlist and the second netlist, wherein the propagating removes structural feedback loops from the first netlist and the second netlist.

4. An apparatus for asserting flush enabling conditions comprising:
means for applying a latch behavior to a first netlist and a second netlist, wherein the latch behavior exhibits transparent behavior;
means for asserting flush enabling conditions to the first netlist and the second netlist;
means for each of a plurality of latches in a first scan chain in the first netlist, finding a corresponding latch in a second scan chain in the second netlist;
means for each of the plurality of latches in the first netlist, extracting a respective plurality of first cones of logic from the first scan chain, and extracting a respective plurality of second cones of logic from the second scan chain; and
means for comparing each of the respective first and second cones of logic for functional equivalence, wherein the means for comparing further comprises means for determining whether a logic function for each of the corresponding latches is equivalent under the flush enabling condition.

5. The apparatus of claim 4, further comprising:
means for reporting that flush reset states of the first netlist and the second netlist are functionally equivalent if each of the respective first and second cones of logic are functionally equivalent.

6. The apparatus of claim 4, further comprising:
means for reporting that flush reset states of the first netlist and the second netlist are not functionally equivalent if at least one of the respective first and second cones of logic are not functionally equivalent.

7. The apparatus of claim 4, wherein output of the plurality of latches provide feedback to combinational logic, wherein the combinational logic provides input to the plurality of latches.

8. A signal-bearing medium that compares cones of logic, wherein the signal-bearing medium is encoded with instructions, wherein the instructions when executed comprise:
applying a latch behavior to a first netlist and a second netlist, wherein the latch behavior exhibits transparent behavior;
asserting flush enabling conditions to the first netlist and the second netlist;
for each of a plurality of latches in a first scan chain in the first netlist, finding a corresponding latch in a second scan chain in the second netlist;
for each of the plurality of latches in the first netlist, extracting a respective plurality of fist cones of logic from the first scan chain, and extracting a respective plurality of second cones of logic from the second scan chain; and
comparing each of the respective first and second cones of logic for functional equivalence, wherein the comparing further comprises determining whether a logic function for each of the corresponding latches is equivalent under the flush enabling condition.

9. The signal-bearing medium of claim 8, further comprising:
reporting that flush reset states of the first netlist and the second netlist are functionally equivalent if each of the respective first and second cones of logic are functionally equivalent.

10. The signal-bearing medium of claim 8, further comprising:
reporting that flush reset states of the first netlist and the second netlist are not functionally equivalent if at least one of the respective first and second cones of logic are not functionally equivalent.

11. The signal-bearing medium of claim 8, wherein output of the plurality of latches provides feedback to combinational logic, wherein the combinational logic provides input to the plurality of latches.

12. The signal-bearing medium of claim 8, wherein the plurality of latches farther comprise a respective plurality of cut points, wherein the plurality of cut points propagate a value from an initial signal.

13. A computer system that reports functional equivalence of flush reset states comprising:
a processor; and
a storage device encoded with instructions, wherein the instructions when executed on the processor comprise:
applying a latch behavior to a first netlist and a second netlist, wherein the latch behavior exhibits transparent behavior,
asserting flush enabling conditions to the first netlist and the second netlist,
for each of a plurality of latches in a first scan chain in the first netlist, finding a corresponding latch in a second scan chain in the second netlist,
for each of the plurality of latches in the first netlist, extracting a respective plurality of first cones of logic from the first scan chain, and extracting a respective plurality of second cones of logic from the second scan chain, comparing each of the respective first and second cones of logic for functional equivalence, wherein the comparing further comprises determining whether a logic function for each of the corresponding latches is equivalent under the flush enabling condition, and reporting that flush reset states of the first netlist and the second netlist are functionally equivalent if each of the respective first and second cones of logic are functionally equivalent.

14. The computer system of claim 13, wherein the instructions further comprise:

reporting that flush reset states of the first netlist and the second netlist are not functionally equivalent if at least one of the respective first and second cones of logic are not functionally equivalent.

15. The computer system of claim 13, wherein output of the plurality of latches provides feedback to combinational logic, wherein the combinational logic provides input to the plurality of latches.

16. The computer system of claim 13, wherein the plurality of latches further comprise a respective plurality of cut points, wherein the plurality of cut points propagate a value from an initial signal.

17. The computer system of claim 13, wherein the transparent behavior further comprises:

when a clock is enabled, data flows through the plurality of latches without stopping.

* * * * *